United States Patent
Schmidt et al.

(10) Patent No.: US 10,451,453 B2
(45) Date of Patent: Oct. 22, 2019

(54) SYSTEM AND METHOD FOR CALIBRATING A MEASURING ARRANGEMENT AND CHARACTERIZING A MEASUREMENT MOUNT

(71) Applicant: Rohde & Schwarz GmbH & Co. KG, Munich (DE)

(72) Inventors: Lorenz-Peter Schmidt, Hessdorf (DE); Marcus Schramm, Strullendorf (DE); Michael Hrobak, Numberg (DE); Jan Schür, Forchheim (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 748 days.

(21) Appl. No.: 14/379,741

(22) PCT Filed: Feb. 20, 2013

(86) PCT No.: PCT/EP2013/053337
§ 371 (c)(1),
(2) Date: Aug. 19, 2014

(87) PCT Pub. No.: WO2013/124295
PCT Pub. Date: Aug. 29, 2013

(65) Prior Publication Data
US 2015/0292921 A1    Oct. 15, 2015

(30) Foreign Application Priority Data

Feb. 20, 2012 (DE) .......... 10 2012 003 285
Feb. 6, 2013 (DE) .......... 10 2013 201 914

(51) Int. Cl.
*G01D 21/00* (2006.01)
*G01R 35/00* (2006.01)
*G01R 27/28* (2006.01)

(52) U.S. Cl.
CPC .......... *G01D 21/00* (2013.01); *G01R 27/28* (2013.01); *G01R 35/005* (2013.01)

(58) Field of Classification Search
CPC ...... G01R 35/005; G01R 27/28; G01R 35/00; G01D 21/00
See application file for complete search history.

(56) References Cited

FOREIGN PATENT DOCUMENTS

| DE | 4332273 A1 | 6/1994 |
|---|---|---|
| DE | 19736897 C2 | 4/1998 |
| EP | 2241899 A1 | 10/2010 |

OTHER PUBLICATIONS

Silvonen, "New Five-Standard Calibration Procedures for Network Analyzers and Wafer Probes", ISBN 951-22-1989-1, dated Jul. 24, 1998, 16 pages.

(Continued)

*Primary Examiner* — Sujoy K Kundu
*Assistant Examiner* — L. Anderson
(74) *Attorney, Agent, or Firm* — Ditthavong & Steiner, P.C.

(57) ABSTRACT

A method and a system for calibrating a measuring arrangement on the basis of a 16-term error model determines a matrix (A) with measured scattering parameters ($S_m$) from different calibration standards (3) and with associated actual scattering parameters ($S_a$) of the calibration standards (3) and determines linear-in-T system errors ($T_i$) for the calibration of a network analyzer (1) by solving a linear equation system with the determined matrix (A). To solve the linear equation system, a first and a second linear-in-T system error (k, p) are freely selected in each case. With use of reciprocal calibration standards, the determined linear-in-T system errors are weighted with the freely selected first (Continued)

linear-in-T system error ($T_i$) or with a correct second linear-in-T system error $p_{kor}(k)$) dependent upon the first linear-in-T system error (k).

9 Claims, 8 Drawing Sheets

(56) References Cited

OTHER PUBLICATIONS

Schramm et al. "MOS-16: A New Method for In-Fixture Calibration and Fixture Characterization", Proceedings of the ARFTG, Baltimore, USA, dated Jun. 2010, XP031972673, 7 pages.

Silvonen, "LMR 16—A Self-Calibration Procedure for a Leaky Network Analyzer", IEEE Transactions on Microwave Theory and Techniques, vol. 45, No. 7, dated Jul. 1997, pp. 1041 to 1049.

Buttler et al., "16-Term Error Model and Calibration Procedure for On-Wafer Network Analysis Measurements", vol. 39, No. 12, dated, Dec. 12, 1991, pp. 2211-2217.

Cascade Microtech, Inc., ttp://www..cmicro.cor3/ . . . [Online!. http://www.cmicro.com/file/making7aocurate-and-reliable.-4-port-on-wafer-measurement, 2009, 4 pages.

Schramm et al., "A SOLR Calibration Procedure for the 16-Term Error Model".

Zhang et al.; "Measurement of a reciprocal four-port transmission line structure using the 16-term error model", XP055066964 dated, Dec. 22, 2006, 6 pages.

Ferro, "A simplified algorithm for leaky network analyzer calibration," IEEE Microwave and Guided Wave Letters. vol. 5, No. 4, Apr. 1995.

International Search Report for International Application No. PCT/EP2013/053337, dated Jun. 26, 2013, 3 pages.

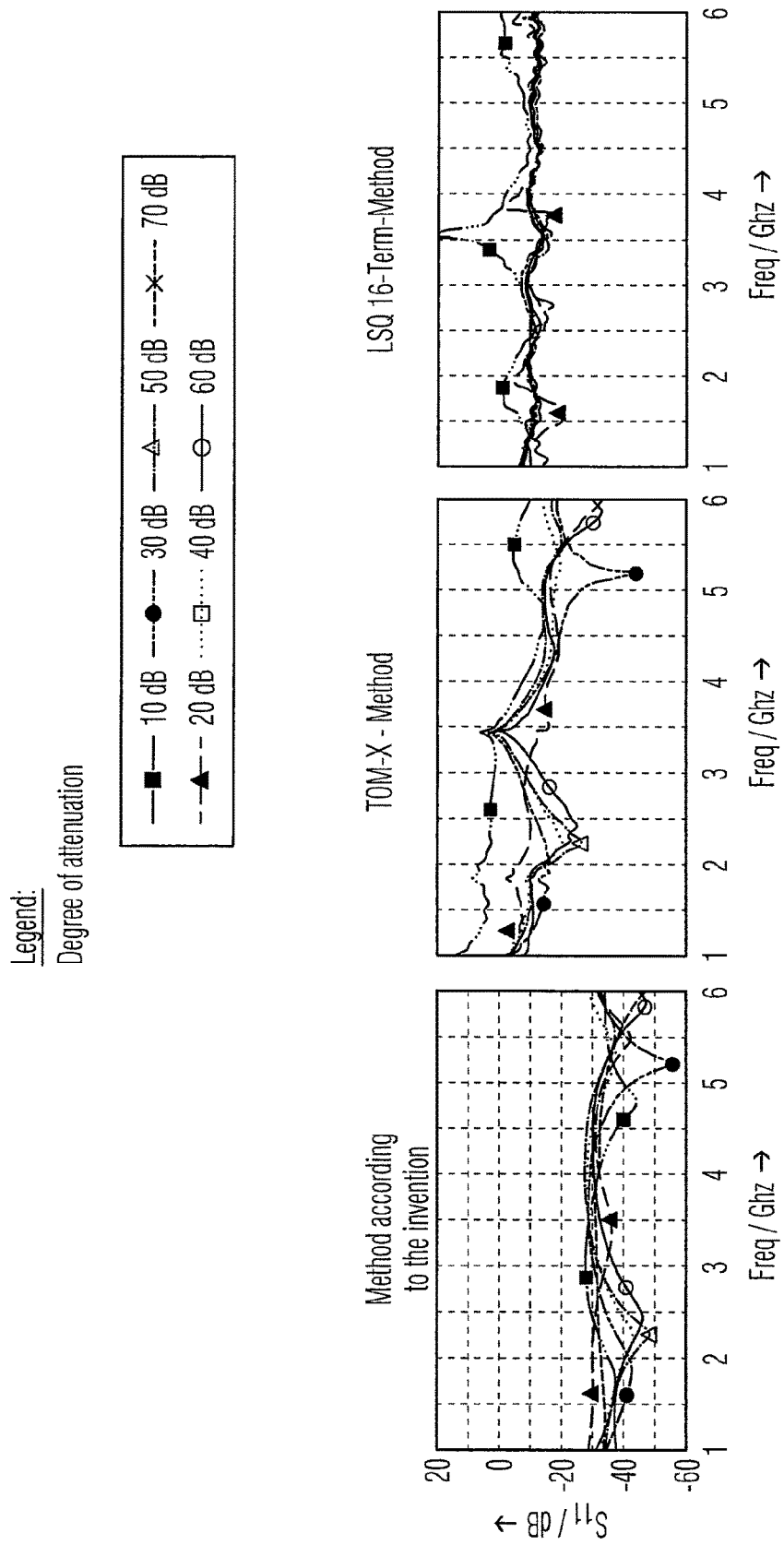

| Number | Std 1 | Std 2 | Std 3 | Std 4 |
|---|---|---|---|---|
| 1 | MO | MS | OO | SM |
| 2 | MO | MS | OS | SM |
| 3 | MO | MS | OM | SO |
| 4 | MO | MS | OM | SS |
| 5 | MO | MM | OO | SS |
| 6 | MO | MM | OS | SO |
| 7 | MO | MM | OS | SM |
| 8 | MO | MM | OM | SS |
| 9 | MO | OO | OS | SM |
| 10 | MO | OO | OM | SS |
| 11 | MO | OS | OM | SS |
| 12 | MO | OS | OM | SM |
| 13 | MO | OS | SO | SM |
| 14 | MO | OS | SS | SM |
| 15 | MO | OM | SO | SS |
| 16 | MO | OM | SS | SM |
| 17 | MS | MM | OO | SS |
| 18 | MS | MM | OO | SM |
| 19 | MS | MM | OS | SO |
| 20 | MS | MM | OM | SO |
| 21 | MS | OO | OS | SM |
| 22 | MS | OO | OM | SO |
| 23 | MS | OO | OM | SM |
| 24 | MS | OO | SO | SM |
| 25 | MS | OO | SS | SM |
| 26 | MS | OS | OM | SO |
| 27 | MS | OM | SO | SS |
| 28 | MS | OM | SO | SM |
| 29 | MM | OO | OS | SO |
| 30 | MM | OO | OS | SS |
| 31 | MM | OO | OM | SS |
| 32 | MM | OO | SO | SS |
| 33 | MM | OO | SS | SM |
| 34 | MM | OS | OM | SO |
| 35 | MM | OS | SO | SS |
| 36 | MM | OS | SO | SM |

Fig. 10

SYSTEM AND METHOD FOR CALIBRATING A MEASURING ARRANGEMENT AND CHARACTERIZING A MEASUREMENT MOUNT

CROSS-REFERENCE TO RELATED APPLICATION

The present application is a national phase application of PCT Application No. PCT/EP2013/053337, filed Feb. 20, 2013, and claims priority to German Application No. DE 10 2012 003 285.4, filed on Feb. 20, 2012, and German Application No. DE 10 2013 201 914.9, filed on Feb. 6, 2013, the entire contents of which are herein incorporated by reference.

BACKGROUND OF THE INVENTION

Field of the Invention

The invention, according to the various embodiments described herein, relates to a system and a method for calibrating a measuring arrangement and characterizing a measurement holder.

Discussion of the Background

If the scattering parameters of a device under test are measured using a network analyzer, the measured scattering parameters of the device under test are influenced by non-idealities of the network analyzer, the measurement lines and the measurement holder in which the device under test is fixed and accordingly do not correspond to the actual scattering parameters of the device under test. The system errors caused by the non-idealities of the network analyzer, the measurement lines and the measurement holder must be determined by means of a calibration. With the system errors determined, the scattering parameters measured by the network analyzer are converted into the actual scattering parameters during the measuring operation.

FIG. 1 shows a measurement model taking the system errors into consideration. The real network analyzer in a non-ideal measuring arrangement determines the measured scattering parameters $S_m$ of the device under test on the basis of the propagated wave values $a_0$ and $a_3$ registered in each case and the registered reflected wave values $b_0$ and $b_3$, which are not contaminated by system errors in each case. The actual scattering parameters $S_a$ of the device under test can be determined on the basis of the wave values $a_1$ and $a_2$ propagated towards the device under test in each case and the wave values $b_1$ and $b_2$ reflected back to the device under test in each case, which are not contaminated with system errors and could be determined only in an ideal measuring arrangement. The wave values $a_1$ and $a_2$ propagated towards the device under test in each case and the wave values $b_1$ and $b_2$ reflected back to the device under test in each case provide a direction contrary to the wave values $a_1$, $a_2$, $b_1$ and $b_2$ illustrated in each case in FIG. 1, which are compared with the error ports containing the system errors E. The real network analyzer determines the wave values $a_1$, $a_2$, $b_1$ and $b_2$ with system errors removed from the registered wave values $a_0$, $a_3$, $b_0$ and $b_3$ contaminated with system errors by means of transformation with the previously determined system errors E. This transformation is designated as a de-embedding (English: de-embedding).

If a crosstalk in the test set-up must be considered when determining the system errors, it is advantageous to use the 16-term error model.

Equation (1) shows in each case the associated mathematical interrelation between the individual elements of the system-error matrix E and the individual propagated wave values $a_0$, $a_1$, $a_2$ and $a_3$ respectively the reflected wave values $b_0$, $b_1$, $b_2$ and $b_3$. It contains a total of 16 elements, from which the name is derived, and is illustrated with its 16 elements in the signal-flow diagram of FIG. 2.

$$\begin{bmatrix} b_0 \\ b_3 \\ b_1 \\ b_2 \end{bmatrix} = \begin{bmatrix} e_{00} & e_{03} & e_{01} & e_{02} \\ e_{30} & e_{33} & e_{31} & e_{32} \\ e_{10} & e_{13} & e_{11} & e_{12} \\ e_{20} & e_{23} & e_{21} & e_{22} \end{bmatrix} \cdot \begin{bmatrix} a_0 \\ a_3 \\ a_1 \\ a_2 \end{bmatrix} = [E] \cdot \begin{bmatrix} a_0 \\ a_3 \\ a_1 \\ a_2 \end{bmatrix} = \begin{bmatrix} E_1 & E_2 \\ E_3 & E_4 \end{bmatrix} \cdot \begin{bmatrix} a_0 \\ a_3 \\ a_1 \\ a_2 \end{bmatrix} \quad (1)$$

The system-error matrix E describes the influence caused by the measuring device, the test set-up and the measurement holder on the wave values $a_1$, $a_2$, $b_1$ and $b_2$ actually present in the measuring device, which leads to the test values $a_0$, $a_3$, $b_0$ and $b_3$ accessible to the measuring device. The secondary diagonal elements of the sub-matrices $E_1$ to $E_4$ describe, in this form, the crosstalk contained in the measurement system. In practice, the crosstalk is caused, for example, by inadequate insulation of the signal paths of the vectorial network analyzer, inadequate shielding of the high-frequency measurement lines and inadequate shielding of the measurement holder, as indicated schematically in FIG. 3 with the example of a test probe.

Equation (2), in which error terms T occur in the place of error terms E, shows an presentation for the interrelation between the individual propagated wave values $a_0$, $a_1$, $a_2$ and $a_3$ respectively the reflected wave values $b_0$, $b_1$, $b_2$ and $b_3$, which is equivalent with equation (1).

$$\begin{bmatrix} b_0 \\ b_3 \\ a_0 \\ a_3 \end{bmatrix} = \begin{bmatrix} t_0 & t_1 & t_4 & t_5 \\ t_2 & t_3 & t_6 & t_7 \\ t_8 & t_9 & t_{12} & t_{13} \\ t_{10} & t_{11} & t_{14} & t_{15} \end{bmatrix} \cdot \begin{bmatrix} a_1 \\ a_2 \\ b_1 \\ b_2 \end{bmatrix} = [T] \cdot \begin{bmatrix} a_1 \\ a_2 \\ b_1 \\ b_2 \end{bmatrix} = \begin{bmatrix} T_1 & T_2 \\ T_3 & T_4 \end{bmatrix} \cdot \begin{bmatrix} a_1 \\ a_2 \\ b_1 \\ b_2 \end{bmatrix} \quad (2)$$

With reference to Silvonen K. "New Five-Standard Calibration Procedures for Network Analyzers and Wafer Probes", ISBN 951-22-1989-1, 24 Jul. 1998, the content of which is accordingly included in the disclosed content of the patent application, equation (3) shows an interrelation between the measured scattering parameters $s_m$ of the device under test, the actual scattering parameters $s_a$ of the device under test and the individual sub-matrices of the system-error matrix E, and equation (4) shows a corresponding interrelation between the measured scattering parameters $s_m$ of the device under test, the actual scattering parameters $s_a$ of the device under test and the individual sub-matrices of the system-error matrix T. While equation (3) leads to a non-linear equation system for determining the system errors E, a linear equation system can be derived from equation (4) for the determination of the system errors T. This presentation of the system errors with the matrix T is therefore designated as a linear-in-T system error—as also in the following—and, in practice, is a conventional form for presenting system errors with the use of a 16-term error model.

$$S_m = E_1 + E_2 \cdot (I - S_a \cdot E_4)^{-1} \cdot S_a \cdot E_3 \quad (3)$$

$$S_m \cdot (T_3 \cdot S_a + T_4) = (T_1 \cdot S_a + T_2) \quad (4)$$

Schramm M. et al. "MOS-16: New Method for In-Fixture Calibration and Fixture Characterization" in Proceedings of the ARFTG, Baltimore, USA, June 2010, describes a 16-term calibration method. Alongside the reciprocity of the measurement holder, this 16-term calibration method disadvantageously requires identical reflection coefficients at the input and output side of the measurement holder in each case.

Another 16-term calibration method is known from Silvonen K. "LMR 16—A Self-Calibration Procedure for a Leaky Network Analyzer" in IEEE Transactions on Microwave Theory and Techniques, Volume 45, Number 7, July 1997, pages 1041 to 1049. Alongside four non-transmissive calibration standards, the calibration method additionally uses a fifth transmissive calibration standard. The transmission behavior of the fifth calibration standard must therefore be known exactly over the entire measurement-frequency range. With the use of a measurement holder, this requirement is, under some circumstances, either technically very difficult or completely impossible.

SUMMARY OF THE INVENTION

Embodiments of a method for calibrating and a method for characterizing and in each case an associated system which overcomes the disadvantages of the publications named above are provided.

In one embodiment, for the case of calibrating a measuring arrangement with the use of calibration standards and also for the case of characterizing a measurement holder in which a calibration standard or device under test is fixed, the transmission and reflection coefficients measured with the network analyzer of, preferably four, non-transmissive calibration standards and one transmissive calibration standard are inserted into an equation system together with the actual properties of the calibration standards taken as known, which allow a determination of 15 linear-in-T parameters, in the case of the calibration, and the calculation of all scattering parameters of a measurement holder, in the case of a characterization.

A maximal rank of 15 is determined from the structure of the equation system obtained for the 16-term error model. Accordingly, the value of one of the 16 linear-in-T system errors can be freely selected and the accordingly selected 16th linear-in-T system error can be used as the scaling value for scaling the other 15 linear-in-T system errors. If only the known non-transmissive calibration standards are used, the resulting equation system provides a maximal rank of 14. With an initially free selection of one further parameter, a solution of the equation system can be found without a use of the transmissive calibration standard. Conventional numerical methods, such as, the Newton-Raphson or the Gauss-Jordan method can be used to solve the linear equation system.

In order to implement a calibration of the measuring arrangement, a total of 15 linear-in-T system errors are required, which provide a dependence on only one $16^{th}$ linear-in-T system error. In the case of the characterization of the measurement holder, all 16 linear-in-T system errors are determined.

As will be explained in greater detail below, in one embodiment, with the use of a transmissive, reciprocal calibration standard, one of the two freely specified linear-in-T system errors—designated in the following as second linear-in-T system errors—can advantageously be determined according to one embodiment of the invention dependent upon the respectively other freely specified linear-in-T system parameter—referred to in the following as first linear-in-T system errors. The remaining 14 linear-in-T system errors determined by solving the linear equation system are finally weighted either with the freely specified first linear-in-T system error or with a correct second linear-in-T system error dependent upon the first linear-in-T system error.

In one embodiment, for the case of the calibration of a measuring arrangement, the fifth transmissive and reciprocal calibration standard is preferably used to determine the dependence of the correct, second linear-in-T system error upon the first linear-in-T system error.

The value of the correct second linear-in-T system error in this context is preferably obtained from exploitation of the reciprocity condition of the transmissive and reciprocal calibration standard.

For this purpose, the measured transmission coefficients of the fifth transmissive calibration standard are converted with the 14 determined linear-in-T system errors, the first and second freely specified linear-in-T system errors into transformed transmission coefficients of the fifth transmissive calibration standard.

A sign to be additionally considered in the value of the correct, second linear-in-T system error can preferably be determined with knowledge of the known electrical properties, by further preference, of the known electrical length, of the fifth transmissive and reciprocal calibration standard by means of plausibility considerations between the electrical length and the transformed transmission coefficients of the fifth calibration standard. In view of the plausibility considerations, advantageously by contrast with the prior art, the actual transmission coefficients of the fifth transmissive and reciprocal calibration standard need not be exactly known.

A preferred characterization according to one embodiment of the invention of a measurement holder connected to a network analyzer, exploits the fact that the parameters characterizing the transmission, reflection and crosstalk behavior of the measurement holder correspond to individual system errors of a system-error matrix E which result from transformation of corresponding linear-in-T system errors, which are derivable from the actual and measured scattering parameters of different calibration standards fixed successively in the measurement holder.

For this purpose, the measured and actual scattering parameters of the calibration standards fixed in the measurement holder are first inserted into a matrix, which, together with the linear-in-T system errors to be determined, forms a linear equation system. The remaining 14 linear-in-T system errors can be determined dependent upon the first and second linear-in-T system error through free selection of a first and second linear-in-T system error, by solving the linear equation system. The determined linear-in-T system errors can be transformed in a conventional manner into corresponding system errors of a system-error matrix E of the 16-term error model.

In the case of the characterization according to one embodiment the invention of a measurement holder connected to a network analyzer, a correct first linear-in-T system error and a correct second linear-in-T system error can be determined. In this manner, the scaling to the first linear-in-T system error can be cancelled, so that the scattering parameters of the measurement holder according to a magnitude and phase are present as elements of the system-error matrix E.

For this purpose, the measurement holder must be reciprocal only with regard to the transmission in its two transmission paths. Advantageously, by contrast with the measuring arrangement in Schramm M. et al. "MOS-16: A New Method for In-Fixture Calibration and Fixture Characterization" in Proceedings of the ARFTG, Baltimore, USA, June 2010, it need not provide an identical reflection behavior at the two inputs or at the two outputs.

In a first preferred embodiment of the characterization according to one or embodiment the invention of a measurement holder connected to a network analyzer, the value of the correct, first linear-in-T system error and the value of the correct second linear-in-T system error is determined in the system-error matrix E, in each case with exploitation of the reciprocity condition of the reciprocal measurement holder and of the reciprocal and transmissive calibration standard fixed in the reciprocal measurement holder, on the basis of two mutually reciprocal transmission coefficients associated respectively with one transmission path of the measurement holder. Since these transmission coefficients of the two transmission paths of the measurement holder in the system-error matrix E provide either a dependence upon the first or the second linear-in-T system error, the first and second linear-in-T system errors can be determined independently of one another.

A sign to be additionally considered in the value of the correct, first linear-in-T system error and a sign to be additionally considered in the value of the correct, second linear-in-T system error can be determined in a first preferred embodiment of the characterization according to one embodiment of the invention of a measurement holder connected to a network analyzer, in each case with knowledge of the known electrical properties, preferably the known electrical length, from one of the transmission paths of the measurement holder by means of plausibility considerations between the electrical length and the mutually reciprocal transmission coefficients in the determined system-error matrix E of one of the two transmission paths of the measurement holder. Advantageously, in this context, the length of the measurement holder need not be known exactly, respectively, only with a knowledge of the phase of ±90°.

In a second preferred embodiment of the characterization according to one embodiment of the invention of a measurement holder connected to a network analyzer, the value of the relation between first and second linear-in-T system error and the sign to be additionally considered in the value of the relation between first and second linear-in-T system error are initially determined by means of a fifth transmissive and reciprocal calibration standard fixed in the measurement holder.

The value of the relationship between first and second linear-in-T system error is preferably obtained in an equivalent manner to the calibration of a measuring arrangement with exploitation of the reciprocity condition of a fifth transmissive and reciprocal calibration standard. For this purpose, transformed transmission coefficients of the fifth transmissive and reciprocal calibration standard are determined by transformation of the measured transmission coefficients of the fifth transmissive calibration standard fixed in the measurement holder with the 14 determined linear-in-T system errors and the first and second linear-in-T system errors.

The sign to be considered in the value of the relationship between first and second linear-in-T system error can be determined in an equivalent manner to the calibration of the measuring arrangement with knowledge of the known electrical properties, preferably the known electrical length, of the fifth transmissive and reciprocal calibration standard, by means of plausibility observation between the electrical length and the transformed transmission coefficients of the fifth transmissive and reciprocal calibration standard which is fixed in the measurement holder.

Following this, either the value of the correct, first linear-in-T system error or the value of the correct, second linear-in-T system error is preferably determined. This is obtained in an equivalent manner to the first embodiment of the characterization according to one embodiment the invention of a measurement holder connected to a network analyzer with exploitation of the reciprocity condition of the reciprocal measurement holder and of the reciprocal and transmissive calibration standard fixed in the reciprocal measurement holder on the basis of two mutually reciprocal transmission coefficients associated with one transmission path of the measurement holder in the system-error matrix E with fixing of a fifth transmissive and reciprocal calibration standard in the measurement holder.

Following this, the sign to be additionally considered in the value of that correct linear-in-T system error—correct first or correct second linear-in-T system error-, of which the value has been previously calculated is determined. The determination of the sign to be additionally considered in the value of the correct first or correct second linear-in-T system error is obtained in an equivalent manner to the first embodiment of the characterization according to one embodiment the invention of a measurement holder connected to a network analyzer with a knowledge of the known electrical properties, preferably the known electrical length, of one of the transmission paths of the measurement holder by means of plausibility considerations between the electrical length and the two mutually reciprocal transmission coefficients of the respective transmission path of the measurement holder in the system-error matrix E with fixing of the fifth transmissive and reciprocal calibration standard in the measurement holder. Advantageously, in this context, the electrical length of the transmission path need not be exactly known.

The value and the sign to be additionally considered in the value of the respectively other correct, linear-in-T system error—this means the correct first or correct second linear-in-T system error—is obtained from the initially determined correct linear-in-T system error and the determined relation between the first and second linear-in-T system error.

Finally, in the method according to one embodiment of the invention for the characterization according to one embodiment of the invention of a measurement holder connected to a network analyzer, the transmission, reflection and crosstalk parameters of the measurement holder are preferably determined from the associated system errors of the system-error matrix E by weighting the linear-in-T system errors determined from the linear equation system of the system-error matrix T in each case with the first or second linear-in-T system error determined correctly with regard to value and sign to be additionally considered in the value, and then transferring into the system-error matrix E.

BRIEF DESCRIPTION OF THE DRAWINGS

The individual embodiments of the method according to one embodiment of the invention and the system according to one embodiment of the invention for calibrating a measuring arrangement and of the method according to one embodiment of the invention and the system according to one embodiment the invention for characterizing a measurement holder connected to a network analyzer are explained in detail in the following, by way of example with reference to the drawings, on the basis of a 16-term error model. The Figs. of the drawings show:

FIG. 9A a frequency diagram of the reflection from several devices under test measured in each case by the method according to one embodiment of the invention, in each case with different reflection properties;

FIG. 9B a frequency diagram of the reflection from several devices under test measured in each case by the TOM-X method, in each case with different reflection properties;

FIG. 9C a frequency diagram of the reflection from several devices under test measured in each case by the LSQ-16-term method, in each case with different reflection properties; and FIG. 10 a table with exemplary combinations of calibration standards for the 16-term calibration according to one embodiment of the invention.

Figure 1:
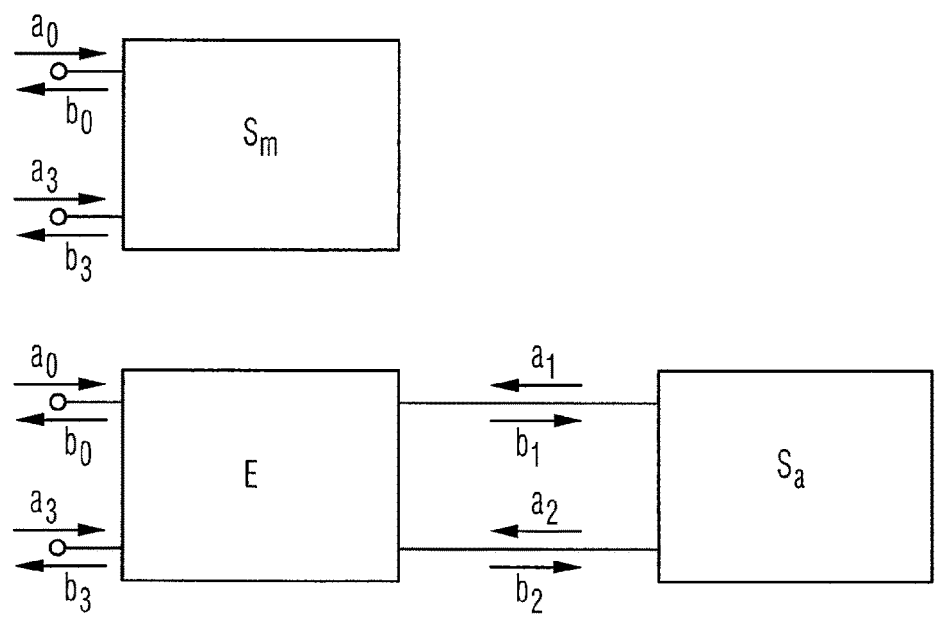
FIG. 1 a block diagram of a conventional measurement model.

Before the technical realizations of various embodiments of the invention are explained in detail with reference to the block diagram in FIG. 4 and the flow diagrams in FIGS. 5, 6A and 6B, the mathematical basis required for understanding the embodiments of the invention will be derived in the following, starting from the mathematical relationships already presented in the introduction.

If the mathematical relationship in equation (4) between the actual scattering parameters $S_a$ of the device under test described mathematically in equation (5A), the measured scattering parameters $S_m$ of the device under test described mathematically in equation (5B) and the coefficients of the linear-in-T system-error matrix T described mathematically in equation (2) are resolved, the relationship in equation (6A) respectively the abbreviated version in equation (6B) is obtained.

$$S_a = \begin{bmatrix} S_{a11} & S_{a12} \\ S_{a21} & S_{a22} \end{bmatrix} \tag{5A}$$

$$S_m = \begin{bmatrix} S_{m11} & S_{m12} \\ S_{m21} & S_{m22} \end{bmatrix} \tag{5B}$$

$$\begin{bmatrix} S_{a11} & S_{a21} & 0 & 0 & 1 & 0 & 0 & 0 & -S_{m11}\cdot S_{a11} & -S_{m11}\cdot S_{a21} & -S_{m12}\cdot S_{a11} & -S_{m12}\cdot S_{a21} & -S_{m11} & 0 & -S_{m12} & 0 \\ S_{a12} & S_{a22} & 0 & 0 & 0 & 1 & 0 & 0 & -S_{m11}\cdot S_{a12} & -S_{m11}\cdot S_{a22} & -S_{m12}\cdot S_{a12} & -S_{m12}\cdot S_{a22} & 0 & -S_{m11} & 0 & -S_{m12} \\ 0 & 0 & S_{a11} & S_{a21} & 0 & 0 & 1 & 0 & -S_{m21}\cdot S_{a11} & -S_{m21}\cdot S_{a21} & -S_{m22}\cdot S_{a11} & -S_{m22}\cdot S_{a21} & -S_{m21} & 0 & -S_{m22} & 0 \\ 0 & 0 & S_{a12} & S_{a22} & 0 & 0 & 0 & 1 & -S_{m21}\cdot S_{a12} & -S_{m21}\cdot S_{a22} & -S_{m22}\cdot S_{a12} & -S_{m22}\cdot S_{a22} & 0 & -S_{m21} & 0 & -S_{m22} \end{bmatrix} \cdot \begin{bmatrix} t_0 \\ t_1 \\ \ldots \\ t_{15} \end{bmatrix} = 0 \tag{6A}$$

$$A^{4\times 16} \cdot t^{16\times 1} = 0 \text{ where}$$

$$t = (t_0 \ t_1 \ t_2 \ t_3 \ t_4 \ t_5 \ t_6 \ t_7 \ t_8 \ t_9 \ t_{10} \ t_{11} \ t_{12} \ t_{13} \ t_{14} \ t_{15})^T \tag{6B}$$

In order to determine the linear-in-T system errors of the vector t according to equation (6B), a total of five calibration standards are used. These are, for example, the four non-transmissive calibration standards OM, SM, MS and SO according to equation (7A), (7B), (7C) and (7D) and the transmissive calibration standard R according to equation (7E). In this context, o denotes an open (English: open) termination, s a short (English: short) termination and m a matched (English: matched) termination of the respective non-transmissive calibration standard and a respectively c a reflection coefficient in each case, and b a transmission coefficient of the transmissive calibration standard.

$$OM = \begin{bmatrix} o & 0 \\ 0 & m \end{bmatrix} \tag{7A}$$

$$SM = \begin{bmatrix} s & 0 \\ 0 & m \end{bmatrix} \tag{7B}$$

$$MS = \begin{bmatrix} m & 0 \\ 0 & s \end{bmatrix} \tag{7C}$$

$$SO = \begin{bmatrix} s & 0 \\ 0 & o \end{bmatrix} \tag{7D}$$

$$R = \begin{pmatrix} a & b \\ b & c \end{pmatrix} \qquad (7E)$$

The table in FIG. 10 reproduces, by way of example, 36 different, possible combinations of the four non-transmissive calibration standards, with which, in each case, a calibration can be implemented.

The 4×16-dimensional matrix $A^{4 \times 16}$ is expanded through the use of five calibration standards instead of a single calibration standard to form a 20×16 matrix $A^{20 \times 16}$ according to equation (8A). Because of its internal structure, the rank of the 20×16 dimensional matrix $A^{20 \times 16}$ is 15. Accordingly, 15 linear-in-T system errors can be scaled by a $16^{th}$ linear-in-T system error. The $16^{th}$ linear-in-T system error is selected freely and independently from zero. The remaining 15 linear-in-T system errors are therefore dependent upon the $16^{th}$ linear-in-T system error in a linear manner.

$$A^{20+16} \cdot t^{16 \times 1} = 0 \qquad (8A)$$

With the four non-transmissive calibration standards, according to equation (7A) to (7D), a matrix $A^{16 \times 16}$ is obtained of which the maximum rank assumes the value 14 because of the internal structure of the equation system. Consequently, in total, 14 linear-in-T system errors of the vector t can be determined. Accordingly, one further linear-in-T system error must still be freely selected. In the following, the first freely selected linear-in-T system error is designated k, the second freely selected linear-in-T system error is designated p. The linear equation system (8A) is therefore transferred into the linear equation system (8B) with the 16×14-dimensional matrix $A^{16 \times 14}$, the 14 linear-in-T system errors $\tilde{t}^{14 \times 1}$ to be determined, the freely selected first and second linear-in-T system errors k and p, and the associated vectors $V_1^{16 \times 1}$ and $V_2^{16 \times 1}$.

$$A^{16 \times 14} \cdot \tilde{t}^{14 \times 1} = -p \cdot V_1^{16 \times 1} - k \cdot V_2^{16 \times 1} \qquad (8B)$$

The values for k and p are preferably each selected to be 1. Since the secondary diagonal elements of the sub-matrices $T_1, T_2, T_3, T_4$ disappear, if no crosstalk is present, the system errors k and p are positioned in primary diagonal elements of the sub-matrices $T_1, T_2, T_3, T_4$. Furthermore, the first freely selected linear-in-T system error k is a linear-in-T system error in a right-hand column of one of the sub-matrices $T_1, T_2, T_3, T_4$—for example $t_{15}$—and the second freely selected linear-in-T system error p is a linear-in-T system error in a left-hand column of one of the sub-matrices $T_1, T_2, T_3, T_4$—for example $t_{12}$- or vice versa.

Since the values k and p for the first and respectively second linear-in-T system error represent merely assumptions which can deviate from the correct values for the first respectively second linear-in-T system error, the remaining 14 linear-in-T system errors obtained from the solution of the linear equation system according to equation (8) represent only intermediate results which may still deviate from the correct linear-in-T system errors. In the following, these intermediate results are supplied, according to equation (9), to a matrix $T_i$ (i=English: intermediate=intermediate result).

$$T_i = \begin{bmatrix} T_{1i} & T_{2i} \\ T_{3i} & T_{4i} \end{bmatrix} \qquad (9)$$

$$T_{1i} = \begin{bmatrix} t_{0i} & t_{1i} \\ t_{2i} & t_{3i} \end{bmatrix} \qquad (10A)$$

$$T_{2i} = \begin{bmatrix} t_{4i} & t_{5i} \\ t_{6i} & t_{7i} \end{bmatrix} \qquad (10B)$$

$$T_{3i} = \begin{bmatrix} t_{8i} & t_{9i} \\ t_{10i} & t_{11i} \end{bmatrix} \qquad (10C)$$

$$T_{4i} = \begin{bmatrix} p & t_{13i} \\ t_{14i} & k \end{bmatrix} \qquad (10D)$$

With regard to the elements $t_{ji}$ of the individual sub-matrices of the matrices $T_i$ according to equation (10A) to (10D), the following property can be derived:

If the individual matrix multiplications in equation (4) are implemented, a 4×4 matrix is obtained on the right-hand and left-hand side of the equals sign, of which the elements 1,1 and 1,2 originate, in each case, only from the two elements in the left column of each of the sub-matrices $T_1$ to $T_4$ and of which elements 2,1 and 2,2 originate in each case only from the two elements in the right column of each of the sub-matrices $T_1$ to $T_4$. Since the freely selected value p is assigned, for example, to the linear-in-T system error $t_{12}$ disposed in the left column of the sub-matrix $T_{4i}$, and the freely selected value k is assigned, for example, to the linear-in-T system error $t_{15}$ disposed in the right column of the sub-matrix $T_{4i}$, all linear-in-T system errors in a left column of the sub-matrices $T_1$ to $T_4$ must provide a dependence only upon k, and all linear-in-T system errors in a right column of the sub-matrices $T_{1i}$ to $T_{4i}$ must provide a dependence only upon p, so that equation (4) continues to provide its validity with the intermediate results for the linear-in-T system errors disposed in the sub-matrices $T_{1i}$ to $T_{4i}$.

In order to separate the effects of p respectively k from the individual linear-in-T system errors $t_{ji}$ determined by solving the linear equation system in each case, a further intermediate value $t_{ji}'$ must be introduced, which is obtained for an element in the left column of the sub-matrices $T_{1i}$ to $T_{4i}$ from the weighting of the relation between the respective correct linear-in-T system error $t_j$ and the correct linear-in-T system error $t_{12}$ according to equation (11A) with the freely selected value p, and for an element in the right column of the sub-matrices $T_{1i}$ to $T_{4i}$ from the weighting of the relation between the respective correct linear-in-T system error $t_j$ and the correct linear-in-T system error $t_{15}$ according to equation (11B) with the freely selected value k. Equation (11A) and (11B) explain the scaling of the remaining 14 linear-in-T system errors through the freely selected first and second linear-in-T system errors k and p.

$$t_{ji}' = \frac{t_j}{t_{12}} \qquad (11A)$$

$$t_{ji}' = \frac{t_j}{t_{15}} \qquad (11B)$$

Accordingly, starting from equations (10A) to (10D) for the sub-matrices $T_{1i}$ to $T_{4i}$, the following relationships are obtained in equation (12A) to (12B):

$$\tilde{T}_{1i} = \underbrace{\begin{pmatrix} pt_{0i}' & kt_{1i}' \\ pt_{2i}' & kt_{3i}' \end{pmatrix}}_{T_{1i}^*} = \underbrace{\begin{pmatrix} t_{0i}' & t_{1i}' \\ t_{2i}' & t_{3i}' \end{pmatrix} \cdot \begin{pmatrix} p & 0 \\ 0 & k \end{pmatrix}}_{N} \qquad (12A)$$

-continued $$\tilde{T}_{2i} = \begin{pmatrix} pt'_{4i} & kt'_{5i} \\ pt'_{6i} & kt'_{7i} \end{pmatrix} = \underbrace{\begin{pmatrix} t'_{4i} & t'_{5i} \\ t'_{6i} & t'_{7i} \end{pmatrix}}_{T^*_{2i}} \cdot \underbrace{\begin{pmatrix} p & 0 \\ 0 & k \end{pmatrix}}_{N} \quad (12B)$$

$$\tilde{T}_{3i} = \begin{pmatrix} pt'_{8i} & kt'_{9i} \\ pt'_{10i} & kt'_{11i} \end{pmatrix} = \underbrace{\begin{pmatrix} t'_{8i} & t'_{9i} \\ t'_{10i} & t'_{11i} \end{pmatrix}}_{T^*_{3i}} \cdot \underbrace{\begin{pmatrix} p & 0 \\ 0 & k \end{pmatrix}}_{N} \quad (12C)$$

$$\tilde{T}_{4i} = \begin{pmatrix} p & kt'_{13i} \\ pt'_{14i} & k \end{pmatrix} = \underbrace{\begin{pmatrix} 1 & t'_{13i} \\ t'_{14i} & 1 \end{pmatrix}}_{T^*_{4i}} \cdot \underbrace{\begin{pmatrix} p & 0 \\ 0 & k \end{pmatrix}}_{N} \quad (12D)$$

If the elements in the left column of the sub-matrices $T_{1i}$ to $T_{4i}$ are weighted with the relation $$\frac{p_{kor}(k)}{p}$$

between the correct linear-in-T system error k still to be determined and dependent upon the freely selected first linear-in-T system error $p_{kor}(k)$, and the originally freely selected value p, with reference to equation (11A) respectively (11B), the respective correct linear-in-T system error $t_j$ is obtained, all of which still provide a dependence upon the freely selected first linear-in-T system error k. Equation (13A) illustrates this weighting, which is also named a re-normalizing, which leads to sub-matrices $T_{1c}$ to $T_{4c}$. According to equation (13B), the individual sub-matrices $T_{1c}$ to $T_{4c}$ result in the linear-in-T system error matrix $T_c$.

$$T_{nc} = T_{ni} \cdot \begin{pmatrix} \frac{p_{kor}(k)}{p} & 0 \\ 0 & 1 \end{pmatrix} \text{ where } n = 1, 2, 3, 4 \quad (13A)$$

$$T_c = \begin{pmatrix} T_{1c} & T_{2c} \\ T_{3c} & T_{4c} \end{pmatrix} \quad (13B)$$

According to one embodiment of the invention, the second linear-in-T system error—for example, the linear-in-T system error $t_{12}$ with the originally freely selected value p—is placed in dependence upon the first linear-in-T system error—for example, the linear-in-T system error $t_{15}$ with the originally freely selected value k. In order to determine the dependence of the second linear-in-T system error upon the first linear-in-T system error, the reciprocity of the fifth reciprocal and transmissive calibration standard R is used according to equation (7E).

For this purpose, starting from a mathematical relationship, also presented in Silvonen K. "New Five-Standard Calibration Procedures for Network Analyzers and Wafer Probes", ISBN 951-22-1989-1, 24 Jul. 1998, between the measured scattering parameters $S_m$ and the actual scattering parameters $S_a$ of a device under test and the individual sub-matrices of the system-error matrix T according to equation (14), a mathematical relationship for scattering parameters $S_{aRez}$ Of the fifth reciprocal and transmissive calibration standard according to equation (15) is introduced with a factorized relationship for the individual sub-matrices $T_1$ to $T_4$ from equation (12A) to (12D). System errors have still not been removed from the scattering parameter $S_{aRez}$ Of the fifth reciprocal and transmissive calibration standard determined according to equation (15), since the sub-matrices $T_1$ to $T_4$ used in the transformation still provide a dependence upon the originally freely selected first and second linear-in-T system errors k and p, which have not yet been accurately determined. Accordingly, the scattering parameters $S_{aRez}$ represent intermediate values and are designated in the following merely as transformed scattering parameters $\tilde{S}_{aRez}$.

$$S_a = (T_1 - S_m \cdot T_3)^{-1} \cdot (S_m \cdot T_4 - T_2) \quad (14)$$

$$\tilde{S}_{arez} = [T_{1i} - S_{mrez} \cdot T_{3i}]^{-1} \cdot [S_{mrez} \cdot T_{4i} - T_{2i}] = \quad (15)$$
$$= [T^*_{1i} \cdot N - S_{mrez} \cdot T^*_{3i} \cdot N]^{-1} \cdot [S_{mrez} \cdot T^*_{4i} \cdot N - T^*_{2i} \cdot N]$$

A mathematical transformation of equation (15) leads to a mathematical relationship for the transformed scattering parameters $S_{aRez}$ of the fifth reciprocal and transmissive calibration standard according to equation (16):

$$\tilde{S}_{arez} = [(T^*_{1i} - S_{mrez} \cdot T^*_{3i}) \cdot N]^{-1} \cdot [(S_{mrez} \cdot T^*_{4i} - T^*_{2i}) \cdot N] = \quad (16)$$
$$= [(N^{-1} \cdot (T^*_{1i} - S_{mrez} \cdot T^*_{3i})^{-1}] \cdot [(S_{mrez} \cdot T^*_{4i} - T^*_{2i}) \cdot N] =$$
$$= N^{-1} \cdot \underbrace{(T^*_{1i} - S_{mrez} \cdot T^*_{3i})^{-1} \cdot (S_{mrez} \cdot T^*_{4i} - T^*_{2i})}_{F_i} \cdot N =$$
$$N^{-1} \cdot F_i \cdot N$$

From equation (16), the mathematical relationships for the two transformed and mutually reciprocal transmission coefficients $\tilde{S}_{arez}(1,2)$ and $\tilde{S}_{arez}(2,1)$ of the fifth reciprocal and transmissive calibration standard to the freely selected parameters k and p of the first and second linear-in-T system error can be determined according to equation (17A) respectively (17B):

$$\tilde{S}_{arez}(1, 2) = \frac{k}{p} \cdot F_i(1, 2) \quad (17A)$$

$$\tilde{S}_{arez}(2, 1) = \frac{p}{k} \cdot F_i(2, 1) \quad (17B)$$

The reciprocity condition $\tilde{S}_{arez}(1,2) = \tilde{S}_{arez}(2,1)$ between the two transformed and mutually reciprocal transmission coefficients $\tilde{S}_{arez}(1,2)$ and $\tilde{S}_{arez}(2,1)$ of the fifth transmissive and reciprocal calibration standard applies only for the case of a correct choice of the parameters p and k. If the parameters p and k are not selected correctly, because the still unknown dependence relationship between the parameters p and k in the free selection of the parameters p and k has typically not been considered, a still unknown relationship factor M accordingly exists between the two transformed transmission coefficients $\tilde{S}_{arez}(1,2)$ and $\tilde{S}_{arez}(2,1)$ according to equation (18):

$$\frac{\tilde{S}_{arez}(1, 2)}{\tilde{S}_{arez}(2, 1)} = M = \frac{k^2 F_i(1, 2)}{p^2 F_i(2, 1)} \quad (18)$$

The relationship factor M therefore follows directly from the transformed transmission coefficients $\tilde{S}_{arez}(1,2)$ and $\tilde{S}_{arez}(2,1)$ and provides the dependence illustrated in equation

(18) upon the freely selected parameters p and k of the first and second linear-in-T system error.

To ensure that the identity of the transmission coefficients following from the reciprocity of the fifth transmissive calibration standard also applies for the transformed transmission coefficients $\tilde{S}_{arez}(1,2)$ and $\tilde{S}_{arez}(2,1)$, the relation of the freely selected parameters must be configured in such a manner that the relationship factor M in equation (18) results in the value one.

Accordingly, a correct second linear-in-T system error $p_{kor}(k)$ must be found, which provides a dependence upon the freely selected first linear-in-T system error k and corrects the relation between the originally freely selected first and second linear-in-T system error k and p. Starting from equation (18), an equation (19) is therefore obtained, which delivers a determination equation for the correct second linear-in-T system error $p_{kor}(k)$.

$$\frac{k^2 \cdot F_i(1, 2)}{F_i(2, 1) \cdot p_{kor}(k)} = 1 \qquad (19)$$

Accordingly, also with reference to equation (18), a mathematical relationship for the relationship factor M follows from equation (19) according to equation (20).

$$M \cdot \frac{p^2}{p_{kor}^2(k)} = 1 \qquad (20)$$

The correct second linear-in-T system error $p_{kor}(k)$ dependent upon the freely selected first linear-in-T system error k is therefore obtained according to equation (21).

$$p_{kor}(k) = \pm \sqrt{M \cdot p^2} \qquad (21)$$

After the re-normalization according to equation (13A), the 15 linear-in-T system errors $t_{ji}$ now provide only a dependence upon the freely selected first linear-in-T system error k. With the 16 linear-in-T system errors $t_{ji}$ determined in this manner, a correct error correction is possible.

The correct sign to be additionally considered in the correct value of the correct second linear-in-T system error $p_{kor}$—the sign which results from the root formation according to equation (21)—can be derived with known correct value of the correct second linear-in-T system error $p_{kor}$ with plausibility considerations between the known electrical length and the scattering parameters $\tilde{S}_{arez}$ of the transmissive and reciprocal calibration standard determinable according to equation (13A) for both possible signs and transformed according to equation (14). The electrical length of the transmissive and reciprocal calibration standard need not be known exactly. An accuracy of the electrical length at the level of ±90° is adequate for the determination.

The linear-in-T system errors of the network analyzer, the high-frequency lines and the measurement holder can be determined in this manner. With system errors determined in this manner, the system errors of the network analyzer, the high-frequency lines and the measurement holder can be removed from the measured values of unknown devices under test to be characterized according to equation (14).

According to the idea of one embodiment of the invention, a measurement holder, which is connected to the network analyzer via the high-frequency measurement lines, and in which calibration standards or a device under test to be characterized is fixed, can be characterized. In this context, the reflection and transmission coefficients of the measurement holder and the individual terms which describe a crosstalk within the measurement holder are regarded as system errors to be determined, which occur between device under test respectively calibration standard and network analyzer or between the reference planes 1 and 2 as shown in FIG. 4.

After the system errors of the network analyzer and the high-frequency lines have been determined in advance within the framework of a preliminary calibration, scattering parameters of reciprocal and non-transmissive calibration standards, which are fixed in succession in the measurement holder in each case, are measured for this purpose in reference plane 1. 14 linear-in-T system errors can be determined from the measured scattering parameters and the actual scattering parameters of the individual calibration standards, as in the calibration method described above, by solving a linear equation system, if a first linear-in-T system error k and a second linear-in-T system error p are freely selected in each case.

In order to determine the reflection and transmission coefficients of the measurement holder and the individual terms which describe a crosstalk within the measurement holder, the individual linear-T system errors are transformed into corresponding system errors of a system-error matrix E of the 16-term error model.

The sub-matrices $E_{1i}$ to $E_{4i}$ of the system-error matrix $E_i$ of the 16-term error model can be determined, as also presented in Silvonen K. "New Five-Standard Calibration Procedures for Network Analyzers and Wafer Probes", ISBN 951-22-1989-1, 24 Jul. 1998, by transformation of the sub-matrices $T_{1i}$ to $T_{4i}$ of the linear-in-T system error matrix $T_i$ according to equations (22A) to (22D).

$$E_{1i} = T_{2i} T_{4i}^{-1} \qquad (22A)$$

$$E_{3i} = T_{4i}^{-1} \qquad (22B)$$

$$E_{2i} = T_{1i} - T_{2i} T_{4i}^{-1} T_{3i} \qquad (22C)$$

$$E_{4i} = -T_{4i}^{-1} T_{3i} \qquad (22D)$$

The inverse sub-matrix $T_{4i}^{-1}$, required for this purpose can be calculated according to equation (23).

$$\tilde{T}_{4i}^{-1} = \begin{pmatrix} \frac{1}{p} d_{11} & \frac{1}{p} d_{12} \\ \frac{1}{k} d_{21} & \frac{1}{k} d_{22} \end{pmatrix} \text{ where} \qquad (23)$$

$$d_{11} = \frac{-1}{t'_1 t'_{13} - 1}$$

$$d_{12} = \frac{t'}{t'_{12} t'_{13} - 1}$$

$$d_{21} = \frac{t'_{13}}{t'_1 t'_{13} - 1}$$

$$d_{22} = \frac{-1}{t'_{12} t'_{13} - 1}$$

After the implementation of the matrix multiplications, the sub-matrices $E_{1i}$ to $E_{4i}$ of the system matrix $E_i$ are obtained according to equations (24A) to (24D):

$$E_{1i} = \begin{pmatrix} -\dfrac{t'_0 - t'_1 t'_{13}}{t'_{12} t'_{13} - 1} & -\dfrac{t'_0 - t'_1 t'_{13}}{t'_{12} t'_{13} - 1} \\ -\dfrac{t'_2 - t'_3 t'_{13}}{t'_{12} t'_{13} - 1} & \dfrac{t'_3 - t'_2 t'_{13}}{t'_{12} t'_{13} - 1} \end{pmatrix} \quad (24A)$$

$$E_{2i} = \begin{pmatrix} \left( \dfrac{t'_0 t'_{13} - t'_4 t'_{10}}{t'_{13}} - \dfrac{(t'_4 - t'_5 t'_{13})(t'_{10} - t'_8 t'_{13})}{t'_{13}(t'_{12} t'_{13} - 1)} \right) p & \left( \dfrac{t'_1 t'_{13} - t'_4 t'_{10}}{t'_{13}} - \dfrac{(t'_4 - t'_5 t'_{13})(t'_{11} - t'_8 t'_{13})}{t'_{13}(t'_{12} t'_{13} - 1)} \right) k \\ \left( \dfrac{t'_2 t'_{13} - t'_6 t'_{10}}{t'_{13}} - \dfrac{(t'_6 - t'_7 t'_{13})(t'_{10} - t'_8 t'_{13})}{t'_{13}(t'_{12} t'_{13} - 1)} \right) p & \left( \dfrac{t'_3 t'_{13} - t'_6 t'_{11}}{t'_{13}} - \dfrac{(t'_6 - t'_7 t'_{13})(t'_{11} - t'_9 t'_{13})}{t'_{13}(t'_{12} t'_{13} - 1)} \right) k \end{pmatrix} \quad (24B)$$

$$E_{3i} = \begin{pmatrix} -\dfrac{1}{(t'_{12} t'_{13} - 1)p} & \dfrac{t'_{12}}{(t'_{12} t'_{13} - 1)p} \\ \dfrac{t'_{13}}{(t'_{12} t'_{13} - 1)k} & -\dfrac{1}{(t'_{12} t'_{13} - 1)k} \end{pmatrix} \quad (24C)$$

$$E_{4i} = \begin{pmatrix} \dfrac{t'_8 - t'_{10} t'_{12}}{t'_{12} t'_{13} - 1} & \dfrac{k(t'_9 - t'_{11} t'_{12})}{p(t'_{12} t'_{13} - 1)} \\ \dfrac{p(t'_{10} - t'_8 t'_{13})}{k(t'_{12} t'_{13} - 1)} & \dfrac{t'_{11} - t'_{11} t'_{12}}{t'_{12} t'_{13} - 1} \end{pmatrix} \quad (24D)$$

Equations (24A) to (24D) explain the effects of the two freely selected parameters k and p for the first and respectively second linear-in-T system error on the calculation of the matrices $E_{ji}$.

Figure 2:
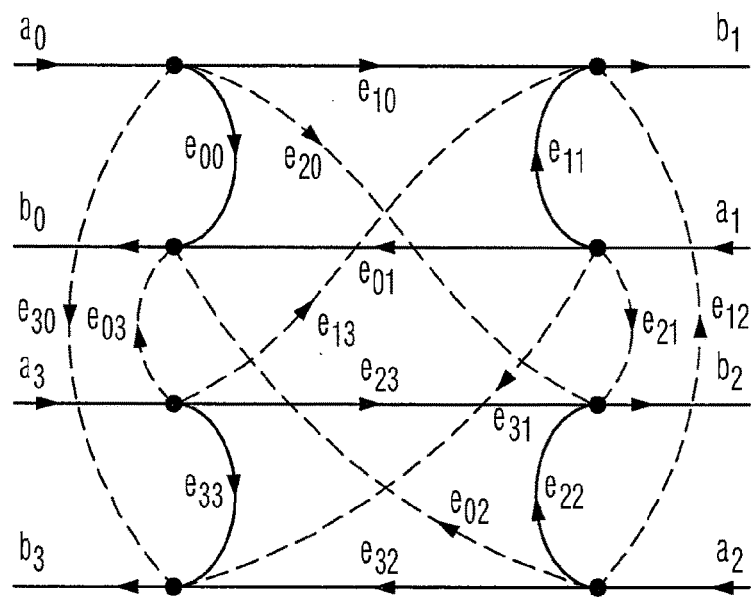
FIG. 2 a signal-flow graph of a 16-term error model.
Figure 3:
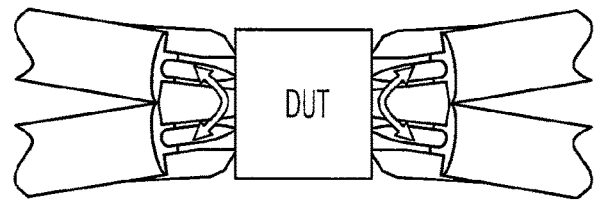
FIG. 3 a presentation of crosstalk in ground-signal-ground-signal-ground measurement-line connections which are connected to a 4-port device under test.

The transmission, reflection and crosstalk parameters of a 4-port unit shown in the signal-flow graph in FIG. 2 can be inserted into the sub-matrices $E_{1i}$ to $E_{4i}$ of the system-error matrix $E_i$ according to equation (25A) to (25D), which provide a dependence upon the freely selected first and second linear-in-T system errors k and p. The error terms of the sub-matrices $E_{2i}$ and $E_{3i}$ with the transmission and crosstalk parameters of a 4-Port unit relevant for further consideration are accordingly obtained as shown in equation (25A) respectively (25B):

$$E_{2i} = \begin{pmatrix} p \cdot e_{01i} & k \cdot e_{02i} \\ p \cdot e_{31i} & k \cdot e_{32i} \end{pmatrix} \quad (25A)$$

$$E_{3i} = \begin{pmatrix} \dfrac{1}{p} \cdot e_{10i} & \dfrac{1}{p} \cdot e_{13i} \\ \dfrac{1}{k} \cdot e_{20i} & \dfrac{1}{k} \cdot e_{23i} \end{pmatrix} \quad (25B)$$

From the two general reciprocity conditions $e_{10} = e_{01}$ and $e_{23} = e_{32}$, in each case between two mutually reciprocal transmission coefficients of the two transmission paths of the measurement holder according to the signal flow graph in FIG. 2, the reciprocity conditions illustrated in equation (26A) and (26B) can be derived for further consideration:

$$E_{2i}(1,1) = E_{3i}(1,1) \quad (26A)$$

$$E_{2i}(2,2) = E_{3i}(2,2) \quad (26B)$$

Since the first linear-in-T system error k and the second linear-in-T system error p are not generally correctly selected, the quotient between the matrix elements $E_{2i}(1,1)$ and $E_{3i}(1,1)$ from equation (26A) and the quotient between the matrix elements $E_{2i}(2,2)$ and $E_{3i}(2,2)$ from equation (26B) results in a relationship factor M different from one. This relationship factor M is obtained in each case starting from (26A) respectively (26B) taking into consideration equation (25A) and (25B), as shown in equation (27A) respectively (27B) in each case.

$$M = \dfrac{E_{3i}(1,1)}{E_{2i}(1,1)} = \dfrac{e_{10i}}{p^2 \cdot e_{01i}} \quad (27A)$$

$$M = \dfrac{E_{3i}(2,2)}{E_{2i}(2,2)} = \dfrac{e_{23i}}{k^2 \cdot e_{32i}} \quad (27B)$$

If the correct second linear-in-T system error $p_{kor}$ is selected in equation (27A) instead of the freely selected second linear-in-T system error p, a relationship factor M=1 is obtained according to equation (28A). In an equivalent manner, if the correct first linear-in-T system error $k_{kor}$ is selected in equation (27B) instead of the freely selected first linear-in-T system error k, a relationship factor M=1 is also obtained according to equation (28B).

$$\dfrac{e_{10i}}{p_{kor}^2 \cdot e_{01i}} = 1 \quad (28A)$$

$$\dfrac{e_{23i}}{k_{kor}^2 \cdot e_{32i}} = 1 \quad (28B)$$

Accordingly, from equation (28A) respectively (28B), a mathematical relationship for the relationship factor M according to equation (29A) respectively (29B) therefore follows in a similar manner.

$$M \cdot \dfrac{p^2}{p_{kor}^2} = 1 \quad (29A)$$

$$M \cdot \dfrac{k^2}{k_{kor}^2} = 1 \quad (29B)$$

Accordingly, starting from equation (29A), a mathematical relationship for the correct second linear-in-T system error $p_{kor}$ and starting from equation (29B) a mathematical relationship for the correct first linear-in-T system error $k_{kor}$ is obtained.

$$p_{kor} = \pm \sqrt{M \cdot p^2} \quad (30A)$$

$$k_{kor} = \pm \sqrt{M \cdot k^2} \quad (30B)$$

The sign of the correct first and second linear-in-T system error $p_{kor}$ and $k_{kor}$ to be additionally considered in the value can be derived in the case of a known correct value of the correct first and second linear-in-T system error $p_{kor}$ and $k_{kor}$ on the basis of plausibility considerations between the known electrical length and the transformed and mutually reciprocal transmission coefficients $E_{2i}(1,1)$ and $E_{3i}(1,1)$, $E_{2i}(2,2)$ and $E_{3i}(2,2)$ of the two transmission paths of the measurement holder. Here also, an accurate knowledge of the electrical length is not necessary. An estimate accuracy of ±90° is sufficient for the correct determination of the correct sign.

The individual sub-matrices $E_{1i}$ to $E_{4i}$ of the system-error matrix $E_i$ partially dependent upon the originally freely selected first and second system errors k and p are transferred into the sub-matrices $E_{1c}$ to $E_{4c}$ of the system-error matrix $E_c$ with the originally freely selected first and second system errors k and p removed, in that the individual elements of the linear-in-T system error sub-matrices $T_{ni}$ originally determined from the linear equation system are weighted with the relationship between the correct first linear-in-T system error $k_{kor}$ and the originally freely selected first linear-in-T system error k or with the relationship between the correct second linear-in-T system error $p_{kor}$ and the originally freely selected second linear-in-T system error p within the framework of the re-normalization. With reference to equations (22A) to (22D), the associated system-error sub-matrices $E_{ci}$ of the system-error matrix $E_c$ are determined from the re-normalized system-error sub-matrices $T_{ci}$ according to equation (31B).

$$T_{nc} = T_{ni} \cdot \begin{bmatrix} \frac{p_{kor}}{p} & 0 \\ 0 & \frac{k_{kor}}{k} \end{bmatrix} \quad (31A)$$

$$E_c = \begin{bmatrix} E_{1c} & E_{2c} \\ E_{3c} & E_{4c} \end{bmatrix} \quad (31B)$$

In the following, the method according to one embodiment of the invention for calibrating a measuring arrangement on the basis of a 16-term error model is explained in detail with reference to the flow diagram in FIG. 5 in conjunction with the system according to one embodiment of the invention for calibrating a measuring arrangement on the basis of a 16-term error model with reference to the block diagram in FIG. 4.

In the first method step S10 of the method according to one embodiment of the invention, the two test ports $P_1$ and $P_2$ of the vectorial network analyzer 1 are connected in succession via the two high-frequency measurement lines $2_1$ and $2_2$ to five calibration standards 3, and the scattering parameters $S_m$ of the five calibration standards are measured. The five calibration standards preferably comprise four non-transmissive calibration standards according to equations (7A) to (7D) in one of the exemplary combinations which are presented in the table of FIG. 10, and one fifth transmissive and reciprocal calibration standard according to equation (7E).

In the next method step S20, a linear equation system according to equation (9B) is prepared. The measured scattering parameters $S_m$ and the actual scattering parameters $S_a$ of the four non-transmissive calibration standards are entered into the 16×14 dimensional matrix $A^{16 \times 14}$ and into the 16-dimensional vectors $V_1^{16 \times 1}$ and $V_2^{16 \times 1}$ in a manner equivalent to equation (6A) for the case of a single calibration standard.

For the freely selected first and second linear-in-T system errors k and p, arbitrary values other than k=0 and p=0 can be used. By preference, a value 1 is selected in each case because the scaling of the 14 remaining linear-in-T system errors at the conclusion of the method according to one embodiment of the invention is simplified in this case.

The 14 linear-in-T system errors to be determined are determined in the next method step S30 dependent upon the freely selected first and second linear-in-T system errors k and p by solving the linear equation system. For this purpose, conventional numerical methods for solving linear equation systems, such as the method for Eigen-value analysis, the Gauss-Jordan method or the Newton-Raphson method can be used.

In the next two method steps S40 and S50, the dependence of the second linear-in-T system error p, which was originally freely selected and is no longer independent from now on, is determined for the freely selected and still independent first linear-in-T system error k, in order to find a total of 15 dependent linear-in-T system errors and one independent linear-in-T system error k for the 16-dimensional solution.

In method step S40, the value of the second linear-in-T system error p is determined dependent upon the freely selected value of the first linear-in-T system error k. For this purpose, the transformed transmission coefficients $S_{arez}(1,2)$ and $S_{arez}(2,1)$ of the fifth transmissive and reciprocal calibration standard R from equation (7E) used as calibration standard 3 are determined according to equation (15) by transforming the measured scattering parameters $S_{mrez}$ of this fifth transmissive and reciprocal calibration standard with the sub-matrices $T_{1i}$ to $T_{4i}$ of the linear-in-T system-error matrix $T_i$ determined in the last method step S30.

The correct value $p_{kor}(k)$ for the second linear-in-T system error dependent upon the freely selected parameter k for the first linear-in-T system error can be determined according to equation (21).

In method step S50, the sign to be additionally considered on the basis of the root formation in the correct value of the second linear-in-T system error $p_{kor}(k)$ is determined on the basis of plausibilities between the known electrical length and the transformed scattering parameters $S_{arez}$ of the fifth transmissive and reciprocal calibration standard determined in the preceding method step S40. For this purpose, for every sign of the roots in equation (21), the associated "signed" correct value of the second linear-in-T system error $p_{kor}(k)$ is used in each case to determine 15-linear-in-T system errors, which are dependent only upon the freely selected first linear-in-T system error k, by "re-normalization" of the 14 linear-in-T system errors determined in method step S30 according to equation (13A). With the accordingly determined 15 linear-in-T system errors, the measured scattering parameters of the fifth transmissive and reciprocal calibration standard are transformed according to equation (14) in order to determine actual scattering parameters (so-called de-embedding). By comparing the phase of the two accordingly determined and mutually reciprocal transmission coefficients with the known electrical length of the fifth transmissive and reciprocal calibration standard, the correct sign to be additionally considered for the correct value of the second linear-in-T system error can be determined by means of plausibility considerations.

In the final method step S60, the correct linear-in-T system errors for the individual sub-matrices $T_{1c}$ to $T_{4c}$ of the linear-in-T system-error matrix $T_c$, which now provide only a dependence upon the first freely selected linear-in-T system error k, are stored for further use, whereas the solution vector with use of the incorrect sign is rejected.

The system errors of the network analyzer, the measurement lines and the measurement holder can be removed from scattering parameters of a device under test measured with the vectorial network analyzer with the elements of the linear-in-T system-error matrix T. For this purpose, for example, the mathematical relationship for system-error adjustment in equation (14) must be used.

In the following, the first embodiment of the method according to one embodiment of the invention for characterizing a measurement holder connected to a network analyzer is explained in detail with reference to the flow diagram in FIG. 6A in conjunction with the system according to one embodiment of the invention for characterizing a measurement holder connected to a network analyzer in the block diagram of FIG. 4.

In the first method step S100 of the method according to one embodiment of the invention, the system errors caused by the vectorial network analyzer and the high-frequency measurement lines are determined by means of a calibration. For this purpose, conventional calibration methods according to the prior art can be used, which determine parameters for error correction by measuring the scattering parameters of calibration standards.

Figure 4:
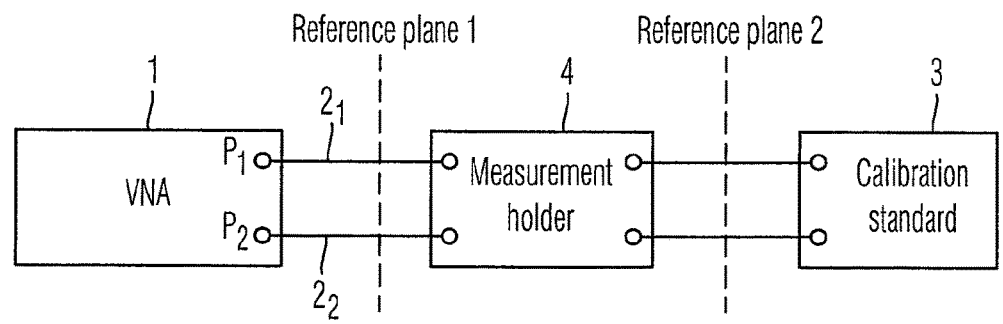
FIG. 4 a block diagram of a system according to one embodiment of the invention for calibrating a measuring arrangement on the basis of a 16-term error model or of a system according to one embodiment of the invention for characterizing a measurement holder connected to a network analyzer.
Figure 5:
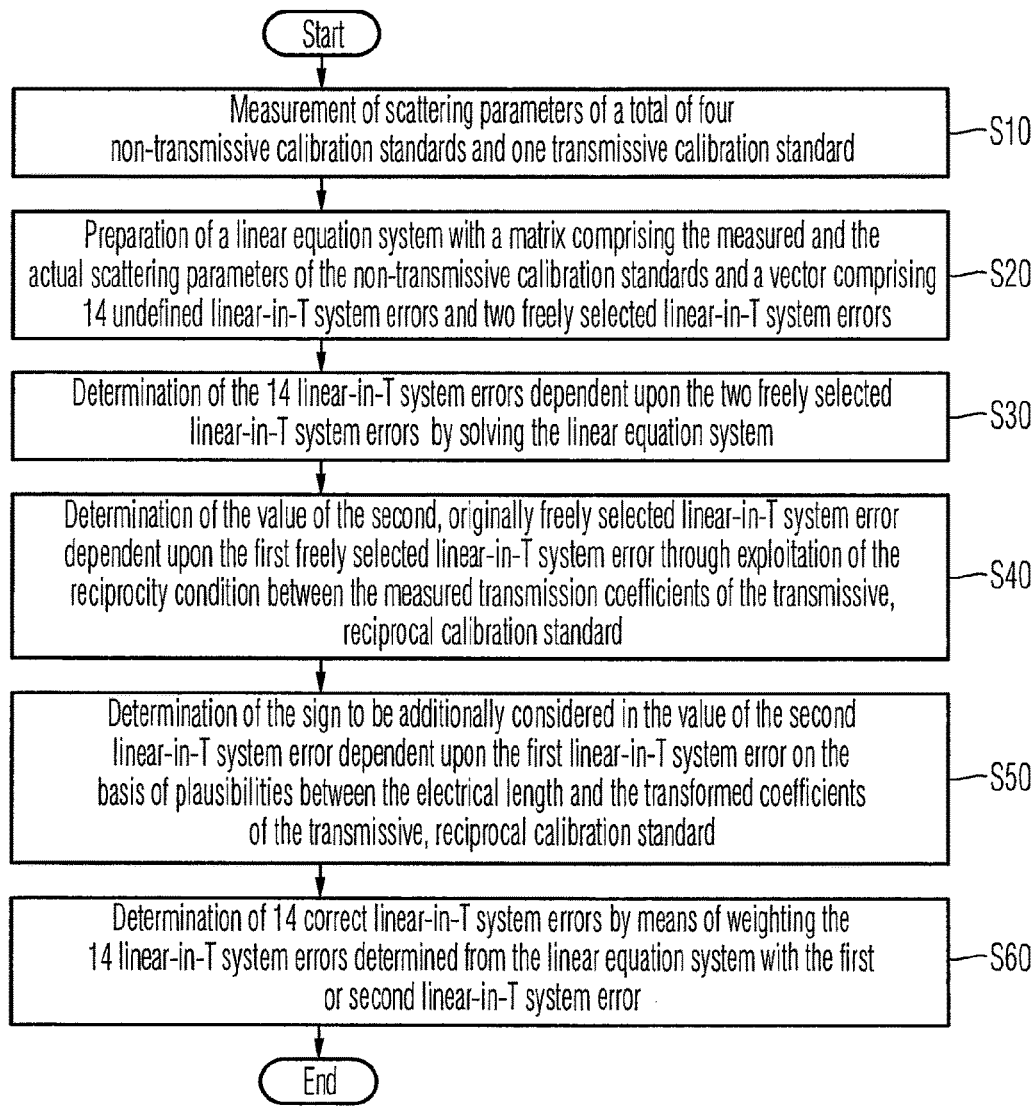
FIG. 5 a flow diagram of a method according to one embodiment of the invention for calibrating a measuring arrangement on the basis of a 16-term error model.
Figure 6A:
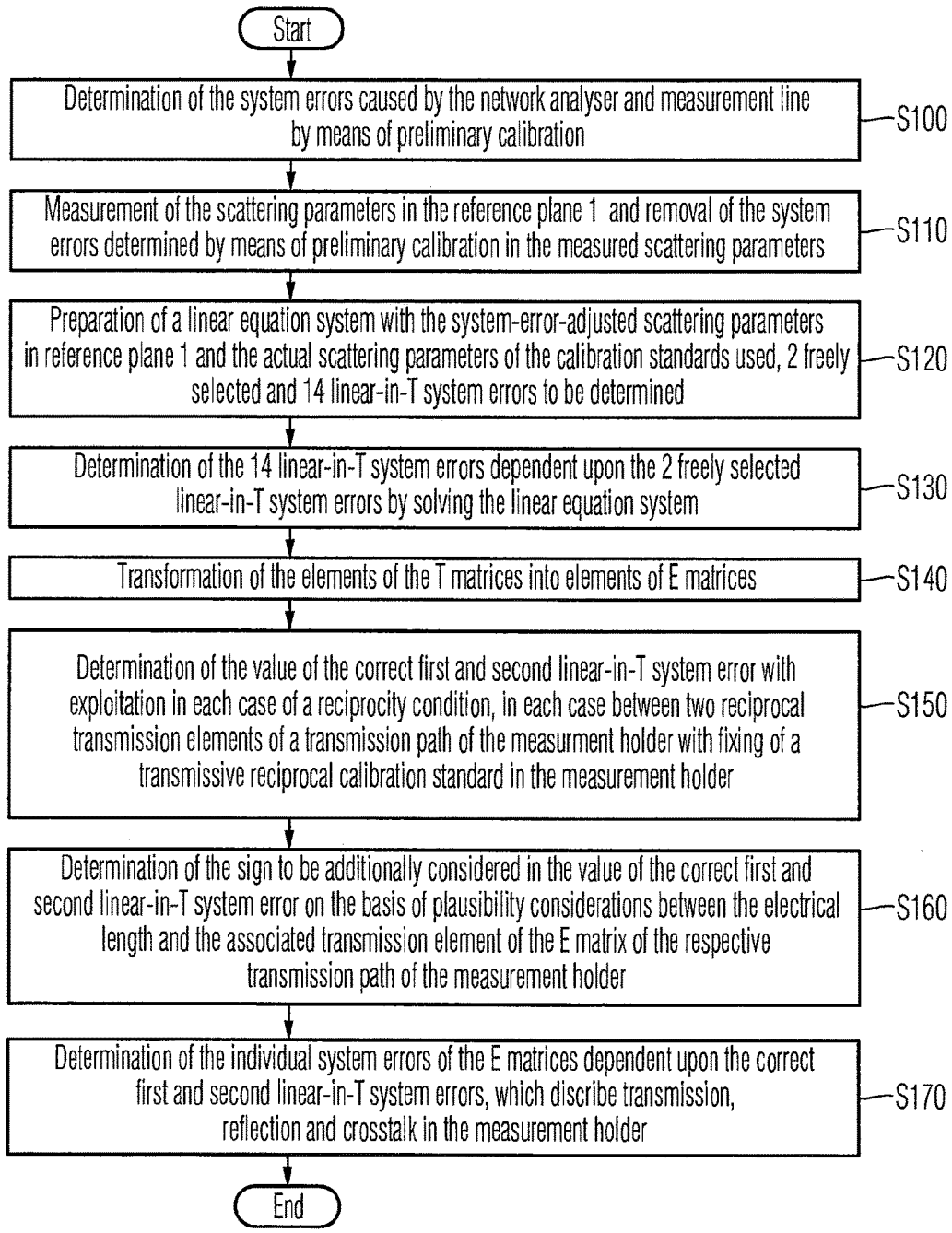
FIG. 6A a flow diagram of a first embodiment of the method according to one embodiment of the invention for characterizing a measurement holder connected to a network analyzer.
Figure 6B:
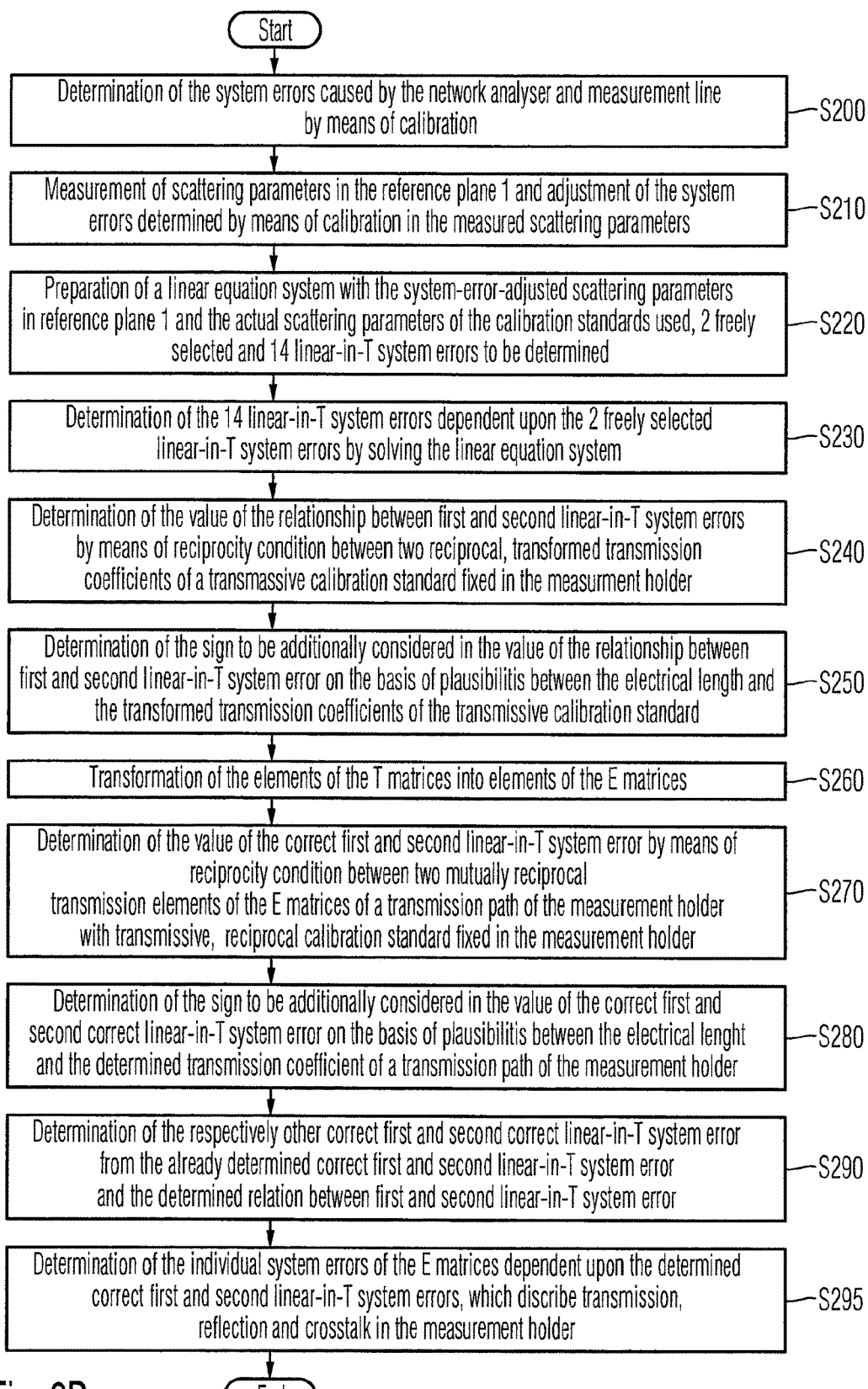
FIG. 6B a flow diagram of a second embodiment of the method according to one embodiment of the invention for characterizing a measurement holder connected to a network analyzer.

In the next method step S110, in an equivalent manner to method step S10 in the case of the method according to one embodiment of the invention for calibrating a measuring arrangement, for example, on the basis of a 16-term error model, the scattering parameters, for example, of a total of four non-transmissive and reciprocal calibration standards according to equation (7A) to (7D) and of one fifth transmissive and reciprocal calibration standard according to equation (7E), which are fixed in succession in a measurement holder 4 according to FIG. 5, are measured in a reference plane 1 as shown in FIG. 4.

The determined system errors of the network analyzer 1 and the measurement lines $2_1$ and $2_2$ are removed from the scattering parameters $S_m$ measured in each case in the reference plane 1 with the parameters determined in the preceding method step S10 according to an appropriate method.

In the next method step S120, in an equivalent manner to method step S20 in the method according to one embodiment of the invention for calibrating a network analyzer, for example, on the basis of a 16-term error model, a linear equation system according to equation (8B) is prepared. In each case the matrix $A^{16 \times 15}$ and the vectors $V_1^{16 \times 1}$ and $V_2^{16 \times 1}$ contain the actual and the measured scattering parameters of the four non-transmissive and reciprocal calibration standards. The first and second linear-in-T system errors k and p are specified appropriately in each case, preferably with the value 1.

The determination of the 14 unknown linear-in-T system errors dependent upon the specified first and second linear-in-T system error k and p by solving the linear equation system in the next method step S130 corresponds to method step S30 in the method according to one embodiment of the invention for calibrating a measuring arrangement on the basis of a 16-term error model.

The linear-in-T system errors determined in this manner or freely specified are supplied to the four sub-matrices $T_{1i}$ to $T_{4i}$ according to equation (12A) to (12D). From the elements of these linear-in-T system error sub-matrices $T_{1i}$ to $T_{4i}$, the corresponding system-error sub-matrices $E_{1i}$ to $E_{4i}$ of the 16-term error model are determined in the next method step S140 using equations (23) and (24A) to (24D).

The system errors determined in this manner in the system-error sub-matrices $E_{1i}$ to $E_{4i}$ of the 16-term error model correspond to the parameters illustrated in the signal-flow graph of FIG. 2, which describe, for a 4-port unit, the transmission behavior—elements $e_{01}, e_{10}, e_{23}, e_{32}$ in FIG. 2—, the reflection behavior—elements $e_{00}, e_{11}, e_{22}, e_{33}$ in FIG. 2—and the crosstalk behavior—elements $e_{30}, e_{03}, e_{20}, e_{13}, e_{31}, e_{02}, e_{21}, e_{12}$ in FIG. 2. In this manner, it is possible to characterize the transmission, reflection and crosstalk behavior of the measurement holder in which the calibration standards or a device under test are fixed by determining the system errors in the system-error matrices $E_{1i}$ to $E_{4i}$ of the 16-term error model.

Since the individual elements of the system-error matrices $E_{1i}$ to $E_{4i}$ of the 16-term error model in some cases also provide dependences upon the first and/or second linear-in-T system errors k and p, in the following method steps S150 and S160, both the first linear-in-T system error k and also the second linear-in-T system error p are determined in each case with regard to the value and the sign to be additionally considered in the value.

In method step S150, the values of the first and second linear-in-T system errors k and p are determined. For this purpose, the fact is exploited that the transmission behavior in both transmission paths of the measurement holder 4 is reciprocal in each case. Accordingly, $e_{10}=e_{01}$ applies in the one transmission path and $e_{23}=e_{32}$ in the other transmission path of the measurement holder.

Since both the transmission coefficient $e_{01}$ in the forward direction of the one transmission path in the element $E_{2i}(1,1)$ of the system-error matrix $E_{2i}$ and also the transmission coefficient $e_{10}$ in the backward direction of the same transmission path in the element $E_{3i}(1,1)$ of the system-error matrix $E_{3i}$ is weighted with the second linear-in-T system error p and are additionally reciprocal to one another ($e_{01}=e_{10}$), the elements $E_{2i}(1,1)$ and $E_{3i}(1,1)$ determined in the last method step S140 for determining the value of the correct second linear-in-T system error $p_{kor}$ according to equation (30A) exploiting the relationship factor M between the elements $E_{2i}(1,1)$ and $E_{3i}(1,1)$ according to equation (27A) are used.

Since, in an equivalent manner, the transmission coefficient $e_{23}$ in the forward direction of the other transmission path of the measurement holder in the element $E_{2i}(2,2)$ of the system-error matrix $E_{2i}$ and also the transmission coefficient $e_{32}$ in the reverse direction of the same transmission path in the element $E_{3i}(2,2)$ of the system-error matrix $E_{3i}$ with the first linear-in-T system error are reciprocal with one another ($e_{23}=e_{32}$) and are additionally weighted in each case with k, the elements $E_{2i}(2,2)$ and $E_{3i}(2,2)$ determined in the last method step S140 for determining the value of the correct first linear-in-T system error $k_{kor}$ according to equation (30B) can be used by exploiting the relationship factor M between the elements $E_{2i}(2,2)$ and $E_{3i}(2,2)$ according to equation (27B).

For the determination of the sign to be additionally considered in the value of the correct first and correct second linear-in-T system error $k_{kor}$ and $p_{kor}$ in the next method step S160, in an equivalent manner to the method according to one embodiment of the invention for calibrating a measuring arrangement on the basis of a 16-term error model, plausibilities, that is, interrelations between the known electrical length and the associated transmission elements in the system-error matrices $E_{2i}$ and $E_{3i}$ of the respective transmission path of the measurement holder 4 are used. Here also, the electrical length need only be known to ±90°. For this purpose, taking into consideration all possible signs, the determined system-error matrices $T_{1i}$ to $T_{4i}$ are re-normalized according to equation (31A) with the correct first and correct second linear-in-T system error $k_{kor}$ and $p_{kor}$ and, from the accordingly obtained system-error matrices $T_{1c}$ to $T_{4c}$, the associated system-error matrices $E_{1c}$ to $E_{4c}$ are determined with reference to equations (22A) to (22D). On the basis of the phases of the transmission coefficients determined in this manner, the correct sign is selected through a consideration of plausibility.

In the final method step S170, the matrices determined with incorrect sign are rejected, so that only adjusted sub-matrices $E_{1c}$ to $E_{4c}$ remain. These form the correct system error matrix $E_c$ according to equation (31B) which contain the elements for characterizing the transmission, reflection and crosstalk behavior of the measurement holder without a remaining normalization factor.

In the following, the second embodiment of the method according to one embodiment of the invention for characterizing a measurement holder connected to a network analyzer is explained in detail on the basis of the flow diagram in FIG. 6B in conjunction with the system according to one embodiment of the invention for characterizing a measurement holder connected to a network analyzer in the block diagram of FIG. 4.

Method steps S200 to S230 of the second embodiment correspond to method steps S100 to S130 of the first embodiment, and the explanation will therefore not be repeated at this point. In the next method steps S240 and S250, the relationship between the first and second linear-in-T system error k and p is determined.

In method step S240, the value of the relationship between the first and second linear-in-T system error k and p is determined by using the measured scattering parameters of the fifth transmissive and reciprocal calibration standard R from equation (7E) fixed in the measurement holder 4. In an equivalent manner to method step S40 of the method according to one embodiment of the invention for calibrating a measuring arrangement on the basis of a 16-term error model, the transformed transmission coefficients $S_{arez}(1,2)$ and $S_{arez}(2,1)$ of the transmissive and reciprocal calibration standard R according to equation (16) fixed in the measurement holder 4 are determined from the measured scattering parameters $S_{mrez}$ and the linear-in-T sub-matrices $T_{1i}$ to $T_{4i}$ determined in method step S230 and dependent upon p and k. The value for the relationship between the second linear-in-T system error p and the first linear-in-T system error k can be determined by analogy with the calculation of the correct second linear-in-T system error $p_{kor}(k)$ dependent upon the freely selected first linear-in-T system error k according to equation (21). Since the measurement holder 4 provides a reciprocal transmission behavior in both transmission paths, the reciprocity condition of the fifth transmissive and reciprocal calibration standard in the reference plane 2 also applies for the measurement in reference plane 1.

In the next method step S250, the sign to be additionally considered in the value of the relationship between the first and second linear-in-T system error k and p is determined in an equivalent manner to the method according to one embodiment of the invention for calibrating a measuring arrangement on the basis of a 16-term error model by means of plausibility considerations, that is, on the basis of plausible interrelations, between the electrical length and the mutually reciprocal transmission coefficients $S_{arez}(1,2)$ and $S_{arez}(2,1)$ of the fifth calibration standard fixed in the measurement holder transformed according to equation (16).

In the next method step S250, the linear-in-T system errors in the sub-matrices $T_{1i}$ to $T_{4i}$ of the linear-in-T system-error matrix $T_i$ determined in method step S230 are transformed by means of the equations (22A) to (22D) into corresponding system errors in the sub-matrices $E_{1i}$ to $E_{4i}$ of the system-error matrix $E_i$ in an equivalent manner to method step S140 of the first embodiment.

In the next method step S270, in an equivalent manner to method step S150 of the first embodiment, the value of the correct first or correct second linear-in-T system error $k_{kor}$ respectively $p_{kor}$ is determined on the basis of equation (30A) respectively (30B) by using for this purpose the transmission elements $E_{2i}(1,1)$ and $E_{3i}(1,1)$ respectively $E_{2i}(2,2)$ and $E_{3i}(2,2)$ of the sub-matrices $E_{2i}$ and $E_{3i}$ of the system-error matrix $E_i$ determined in the preceding method step S260.

In the next method step S280 also, in an equivalent manner to method step S160 of the first embodiment, the sign to be additionally considered in the value of the correct first linear-in-T system error $k_{kor}$ or the correct second linear-in-T system error $p_{kor}$ is determined on the basis of plausibility considerations between the electrical length and the two mutually reciprocal transmission coefficients of one transmission path of the measurement holder determined in method step S260 as elements in a sub-matrix of the system-error matrix $E_i$.

In the next method step S290, the respectively other correct—first or second—linear-in-T system error $k_{kor}$ or $p_{kor}$ is determined on the basis of the value established in each case in method steps S240 and S250 and the sign to be additionally considered in the value of the relation between first and second linear-in-T system error k and p and of the value established in the preceding method steps S270 and S280 in each case and the sign to be additionally considered in the value of the first correct linear-in-T system error $k_{kor}$ or the second correct linear-in-T system error $p_{kor}$. The final method step S295 corresponds to the method step S170 in the first embodiment, and the explanation will therefore not be repeated at this point.

If the individual elements of the system-error matrix $E_c$ have been determined according to the first and second embodiment, a device under test fixed in the measurement holder 4 can be characterized by removing the system errors of the network analyzer 1 and the high-frequency measurement lines $2_1$ and $2_2$ and the transmission, reflection and crosstalk influences of the measurement holder 4 from the scattering parameters $S_m$ measured with the vectorial network analyzer 1 in the reference plane 1 with the elements of the determined system-error matrix $E_c$ transformed into linear-in-T system errors. This corresponds to a measurement of the scattering parameters of the device under test in the reference plane 2.

Figure 7:
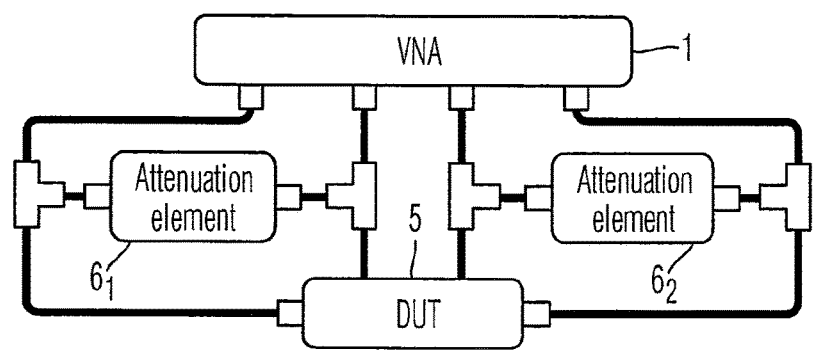
FIG. 7 a block diagram of a measuring arrangement for verification of the method according to one embodiment of the invention.

FIG. 7 shows a measuring arrangement, with which the suitability of the method according to one embodiment of the invention for different levels of crosstalk in a device under test (English: device under test (DUT)) by comparison with other calibration methods can be determined with the assistance of a vectorial network analyzer 1. In this context, the input-end and output-end crosstalk between the input-end ports and between the output-end ports is simulated in each case by an attenuation element $6_1$ and $6_2$ with adjustable loss factor between the input-end ports and between the output-end ports. Accordingly, the degree of attenuation of the attenuation element $6_1$ and $6_2$ is varied in order to simulate different levels of crosstalk.

Figures 8A, 8B, 8C:
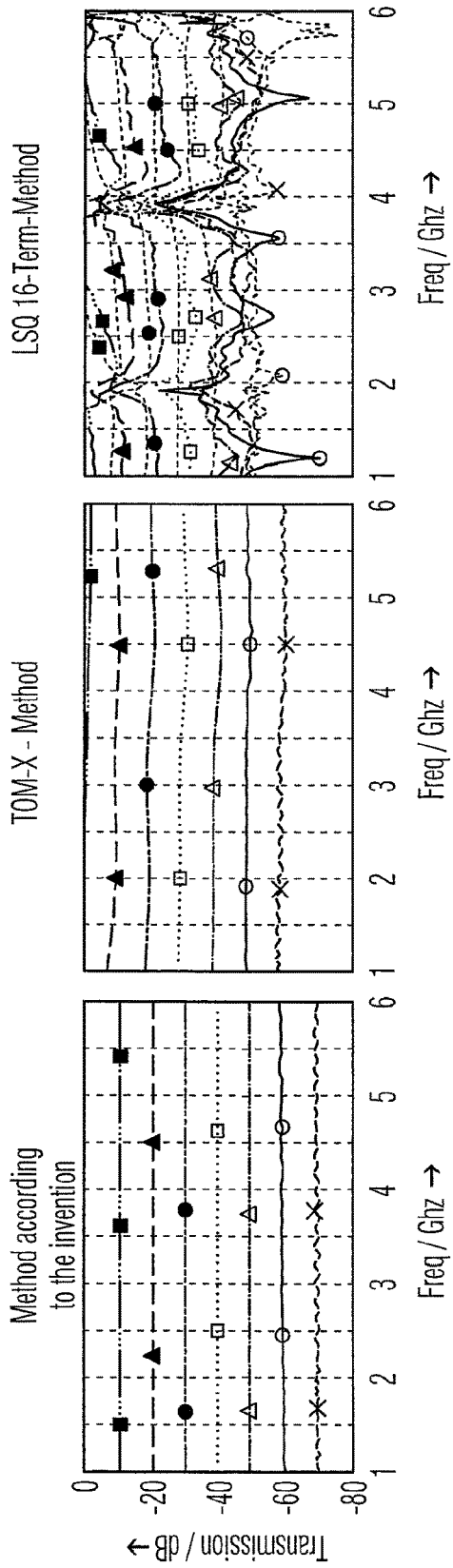
FIG. 8A a frequency diagram of the transmission coefficients of several devices under test measured in each case by the method according to one embodiment of the invention, in each case with different transmission properties.
FIG. 8B a frequency diagram of the transmission coefficients of several devices under test measured in each case by the TOM-X method, in each case with different transmission properties.
FIG. 8C a frequency diagram of the transmission coefficients of several devices under test measured in each case by the LSQ-16-term method, in each case with different transmission properties.

For an adjusted crosstalk at the level of −30 dB, FIGS. 8A to 8C show the suitability of the respective method with regard to the correct measurement of the transmission behavior in the case of several devices under test each with different transmission properties by presenting the transmission coefficients $S_{12}$ and $S_{21}$ measured with the measuring arrangement in FIG. 7 over the measurement-frequency range, while FIGS. 9A to 9C explain the suitability of the respective method with regard to the correct measurement of the reflection behavior with several devices under test each with different reflection properties by presenting the measured reflection coefficient $S_{11}$ over the measurement-frequency range.

FIGS. 8A and 9A present the measurement results delivered by the method according to one embodiment of the invention, while FIGS. 8B and 9B show the measured results of the TOM-X method regarded as the prior art—the letters in this context denote the calibration standards used (Through=transmissive, Open=open and Matched=matched) and the suitability for measuring crosstalk (X)—and FIGS. 8C and 9C show the measured results of a method which solves the 20×16-dimensional equation system according to a method of the least-squared error. This is designated in the following as LSQ-16-method. In particular, the high precision of the transmission measurement of the method according to one embodiment of the invention is evident by comparison with the TOM-X method and the LSQ-16 method over the entire measurement-frequency range. In this context, the same transmission standard was used for all methods. For the results presented, a 3 dB attenuation element was used as a transmission standard.

At this point, reference is made to the fact that additional crosstalk can erroneously occur through numerical inaccuracies of the method used for solving the linear equation system in the case of measured data with superposed noise. This disadvantageous restriction of the dynamic range of the measurement with the use of a 16-term error model is significantly limited in the method according to one embodiment of the invention by comparison with other methods of the prior art.

The method according to one embodiment of the invention and the systems according to one embodiment of the invention are not restricted to the embodiments presented. In particular, measurements on devices under test and measurement holders with more than two ports are also covered by one embodiment of the invention by using the method according to one embodiment of the invention sequentially, in each case for two ports of the device under test, respectively measurement holder. In particular, the combination of all of the features claimed in the patent claims, all of the features disclosed in the description and all of the features presented in the Figs. of the drawings are also covered by the one embodiment of invention.

The invention claimed is:

1. A method for characterizing a measurement holder connected to a network analyzer based on an error model, wherein the method comprises:
   determining a matrix with measured scattering parameters from different calibration standards in the measurement holder and with associated actual scattering parameters of the calibration standards;
   determining linear-in-T system errors of the error model by solving a linear equation system with the matrix; and
   transforming the linear-in-T system errors into corresponding system errors of a system-error matrix of the error model which characterizes the measurement holder,
   wherein in order to solve the linear equation system, a first and second linear-in-T system error are each selected and the given system error of the system-error matrix is weighted with a correct first linear-in-T system error or with a correct second linear-in-T system error,
   a value of the correct first and correct second linear-in-T system error is determined by a reciprocity condition between two reciprocal transmission coefficients of a transmission path of the measurement holder in the system-error error matrix of a transmissive reciprocal calibration standard in the measurement holder, and
   wherein system errors previously caused by the network analyzer and by measurement lines are determined by calibration, and the previously determined system errors are removed from the measured scattering parameters by the different calibration standards in the measurement holder.

2. The method according to claim 1, wherein the measurement holder is reciprocal with regard to its transmission.

3. The method according to claim 1, wherein the calibration standards include a total of four non-transmissive calibration standards; and/or wherein the error model is a 16-term error model.

4. The method according to claim 1, wherein the value of the correct first and correct second linear-in-T system error is determined based on known electrical properties, including an electrical length, and two reciprocal transmission coefficients of a transmission path of the measurement holder in the system-error error matrix with the transmissive and reciprocal calibration standard in the measurement holder.

5. A method for characterizing a measurement holder connected to a network analyzer based on an error model, wherein the method comprises:
   determining a matrix with measured scattering parameters from different calibration standards in the measurement holder and with associated actual scattering parameters of the calibration standards;
   determining linear-in-T system errors of the error model by solving a linear equation system with the matrix; and
   transforming the linear-in-T system errors into corresponding system errors of a system-error matrix of the error model which characterizes the measurement holder,
   wherein in order to solve the linear equation system, a first and second linear-in-T system error are each selected and the given system error of the system-error matrix is weighted with a correct first linear-in-T system error or with a correct second linear-in-T system error,
   wherein a value of a relationship between the first and second linear-in-T system error is determined by a reciprocity condition from transformed transmission factors of a transmissive and reciprocal calibration standard in the measurement holder, and
   wherein the transformed transmission factors of the transmissive and reciprocal calibration standard in the measurement holder is implemented by transformation of measured transmission factors of the transmissive and reciprocal calibration standard in the measurement holder with the given linear-in-T system errors.

6. The method according to claim 5, wherein the value of the relationship between the first and second linear-in-T system error is determined based on known electrical properties, including an electrical length, and the transformed transmission factors of the transmissive and reciprocal calibration standard in the measurement holder.

7. A method for characterizing a measurement holder connected to a network analyzer based on an error model, wherein the method comprises:
   determining a matrix with measured scattering parameters from different calibration standards in the measurement holder and with associated actual scattering parameters of the calibration standards;
   determining linear-in-T system errors of the error model by solving a linear equation system with the matrix; and
   transforming the linear-in-T system errors into corresponding system errors of a system-error matrix of the error model which characterizes the measurement holder,
   wherein in order to solve the linear equation system, a first and second linear-in-T system error are each selected and the given system error of the system-error matrix is weighted with a correct first linear-in-T system error or with a correct second linear-in-T system error,
   wherein a value of a relationship between the first and second linear-in-T system error is determined by a reciprocity condition from transformed transmission factors of a transmissive and reciprocal calibration standard in the measurement holder, and
   wherein the value of either the correct first or the correct second linear-in-T system error is determined by a reciprocity condition between two reciprocal transmission coefficients of a transmission path of the measurement holder in the system error matrix with the transmissive and reciprocal calibration standard in the measurement holder.

8. The method according to claim 7, wherein the value of either the correct first or the correct second linear-in-T system error is determined by interrelations between known electrical properties, including an electrical length, and two reciprocal transmission coefficients of a transmission path of the measurement holder in the system error matrix of the transmissive and reciprocal calibration standard in the measurement holder.

9. The method according to claim 8, wherein the value of another correct first or correct second linear-in-T system error is determined on the basis of the determined value and of the determined sign to be additionally considered in the value of the first or the second linear-in-T system error and of the determined value and of the determined sign of the relationship between the first and second linear-in-T system error to be additionally considered.

* * * * *